(12) United States Patent
Nomura et al.

(10) Patent No.: US 11,314,634 B2
(45) Date of Patent: Apr. 26, 2022

(54) ELECTRONIC CONTROL UNIT AND DATA PROTECTION METHOD THEREFOR

(71) Applicant: HITACHI AUTOMOTIVE SYSTEMS, LTD., Hitachinaka (JP)

(72) Inventors: Takashi Nomura, Isesaki (JP); Koji Yuasa, Isesaki (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 148 days.

(21) Appl. No.: 16/334,339

(22) PCT Filed: Oct. 24, 2017

(86) PCT No.: PCT/JP2017/038322
§ 371 (c)(1),
(2) Date: Mar. 18, 2019

(87) PCT Pub. No.: WO2018/079537
PCT Pub. Date: May 3, 2018

(65) Prior Publication Data
US 2019/0278702 A1 Sep. 12, 2019

(30) Foreign Application Priority Data

Oct. 31, 2016 (JP) .............................. JP2016-212894

(51) Int. Cl.
*G06F 12/02* (2006.01)
*G06F 11/14* (2006.01)
(Continued)

(52) U.S. Cl.
CPC .......... *G06F 12/0238* (2013.01); *G06F 11/14* (2013.01); *G06F 12/16* (2013.01);
(Continued)

(58) Field of Classification Search
CPC ...... G06F 12/0238; G06F 12/16; G06F 11/14; G11C 16/26; G11C 11/5642; G11C 11/1697
See application file for complete search history.

(56) References Cited

U.S. PATENT DOCUMENTS

2003/0140261 A1  7/2003  Takasaki et al.
2004/0155624 A1  8/2004  Amano et al.
(Continued)

FOREIGN PATENT DOCUMENTS

JP   2003-216281 A   7/2003
JP   2004-178067 A   6/2004
(Continued)

OTHER PUBLICATIONS

Office Action issued in corresponding Japanese Patent Application No. 2016-212894 dated Jun. 9, 2020 with partial English translation thereof.

*Primary Examiner* — Masud K Khan
(74) *Attorney, Agent, or Firm* — Foley & Lardner LLP

(57) ABSTRACT

An ECU includes a RAM; a non-volatile memory; and a controller for controlling reading of data from, and writing of data into, the RAM and non-volatile memory. The controller is configured to: store data generated during operation into the RAM, write the data into a storage area of the non-volatile memory when the operation stops, and read the data from the non-volatile memory into the RAM when the operation starts, and control a control target using the data. When determining that an improper reset is expected, the controller writes at least part of the data generated during the operation and stored in the RAM into a save area, different from the data storage area, of the non-volatile memory. When the operation restarts from the improper reset, the
(Continued)

controller reads, into the RAM, the data that has been written in the storage and save areas.

12 Claims, 6 Drawing Sheets

(51) Int. Cl.
| | |
|---|---|
| *G11C 11/16* | (2006.01) |
| *G11C 11/56* | (2006.01) |
| *G11C 16/26* | (2006.01) |
| *G06F 12/16* | (2006.01) |

(52) U.S. Cl.
CPC ...... *G11C 11/1697* (2013.01); *G11C 11/5642* (2013.01); *G11C 16/26* (2013.01)

(56) References Cited

U.S. PATENT DOCUMENTS

| | | | |
|---|---|---|---|
| 2009/0289498 A1 | 11/2009 | Hontani et al. | |
| 2011/0180031 A1* | 7/2011 | Hamane | F02N 11/0825 |
| | | | 123/179.4 |
| 2017/0168890 A1* | 6/2017 | Marripudi | G06F 3/0619 |
| 2017/0287193 A1* | 10/2017 | Hisada | G09G 5/36 |

FOREIGN PATENT DOCUMENTS

| | | |
|---|---|---|
| JP | 2004-194364 A | 7/2004 |
| JP | 2008-105466 A | 5/2008 |
| JP | 2011-100416 A | 5/2011 |
| JP | 2014-075078 A | 4/2014 |
| JP | 2014-169013 A | 9/2014 |

* cited by examiner

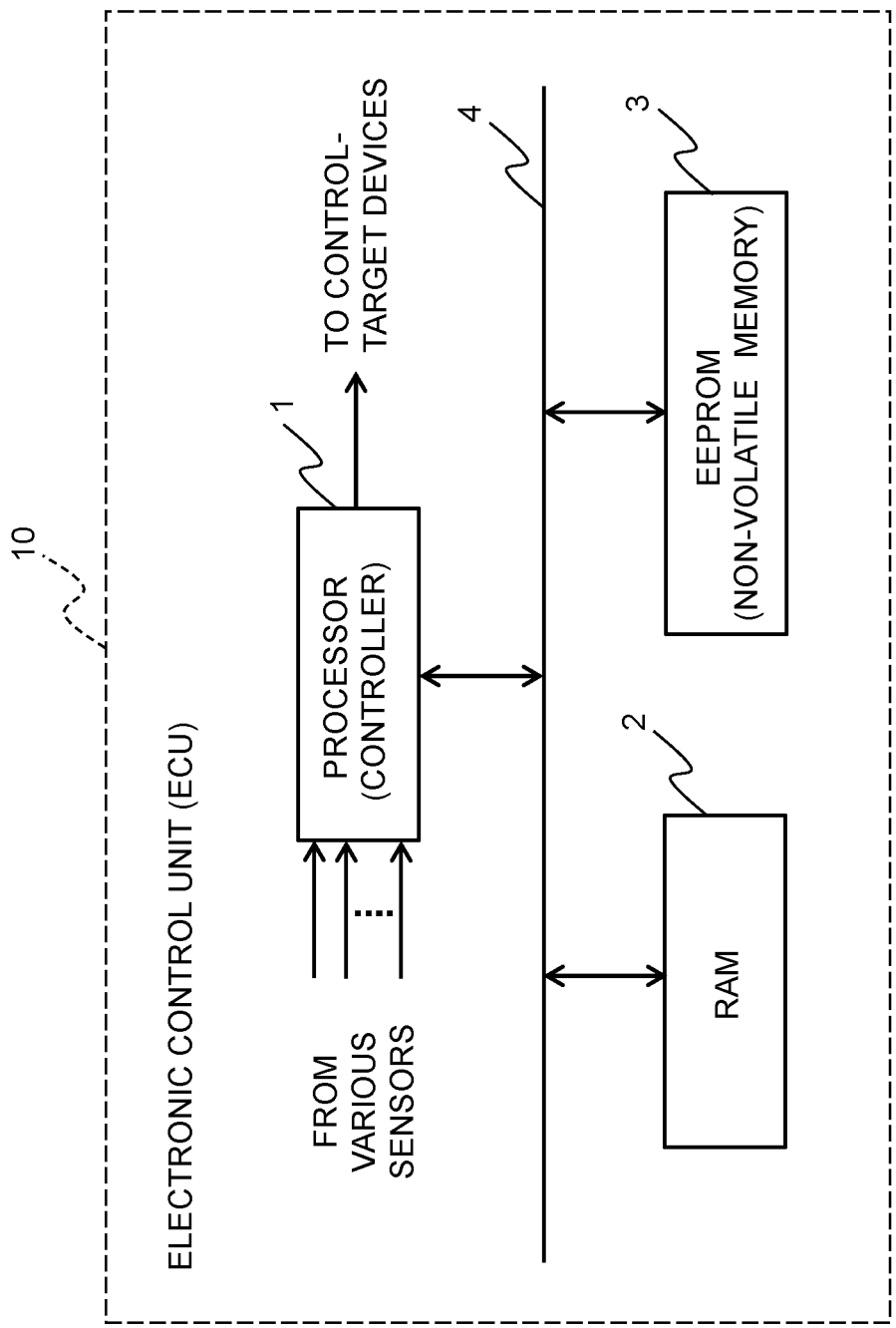
[FIG. 1]

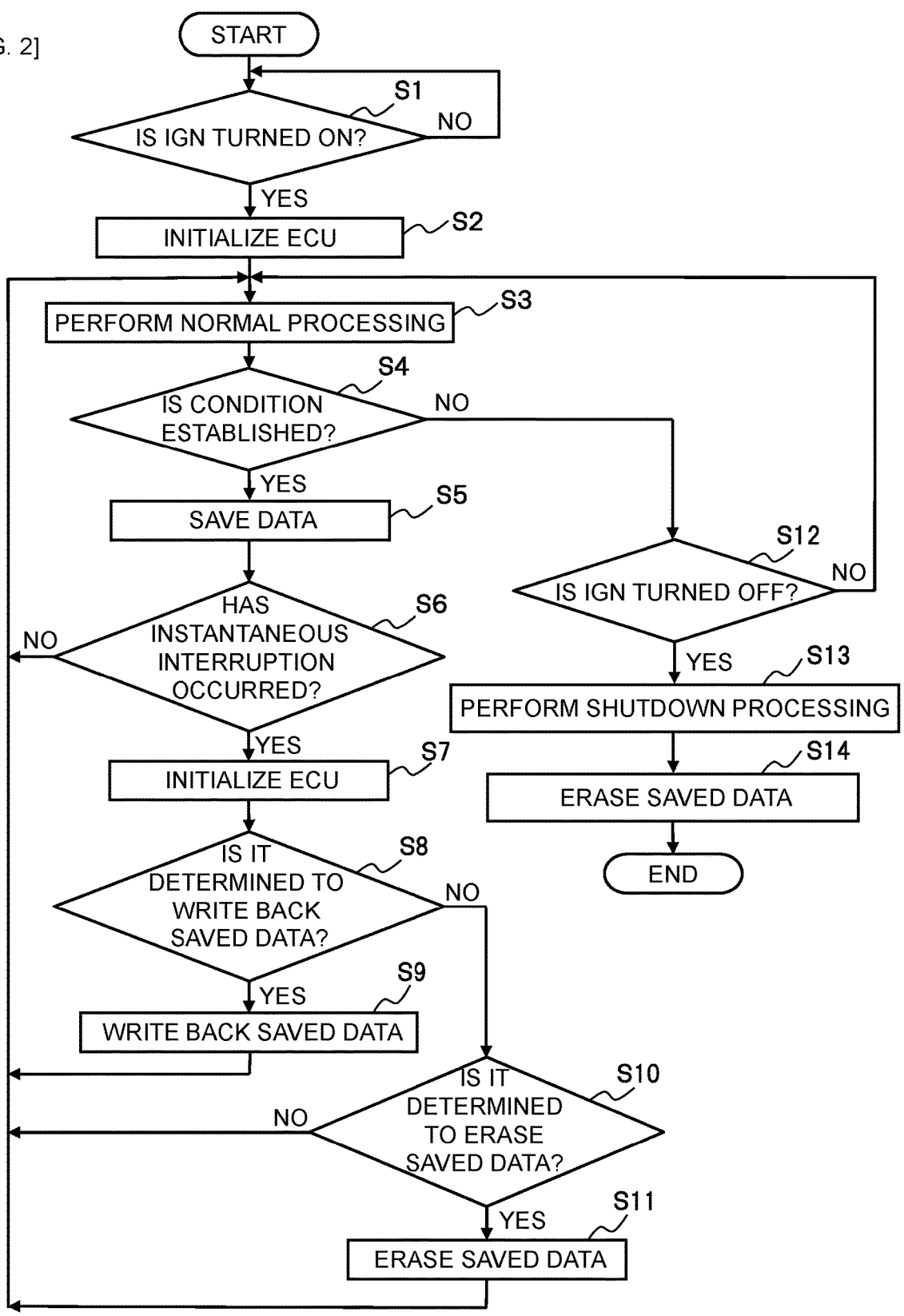

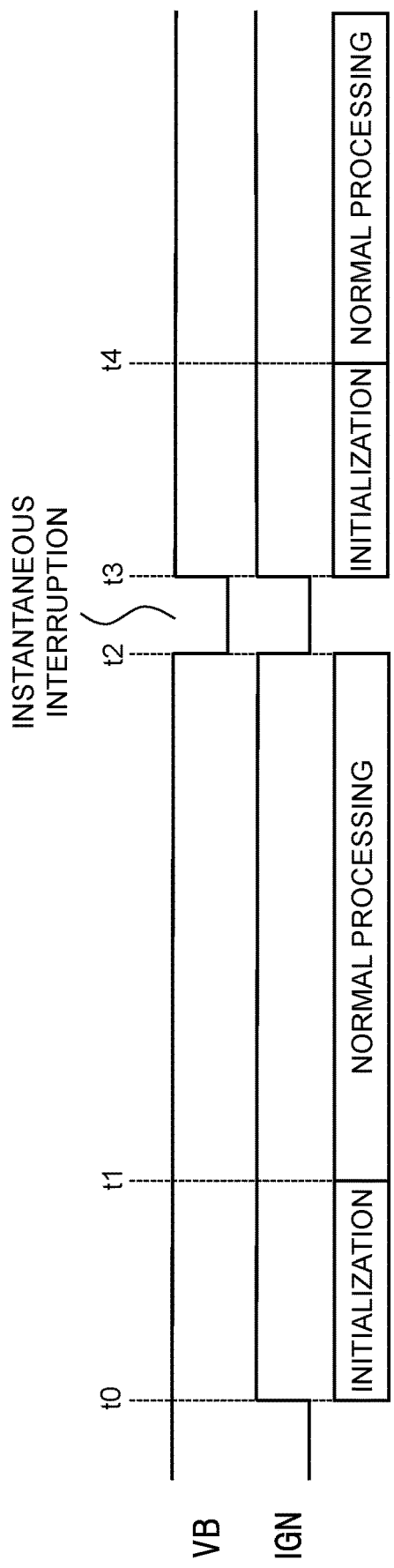

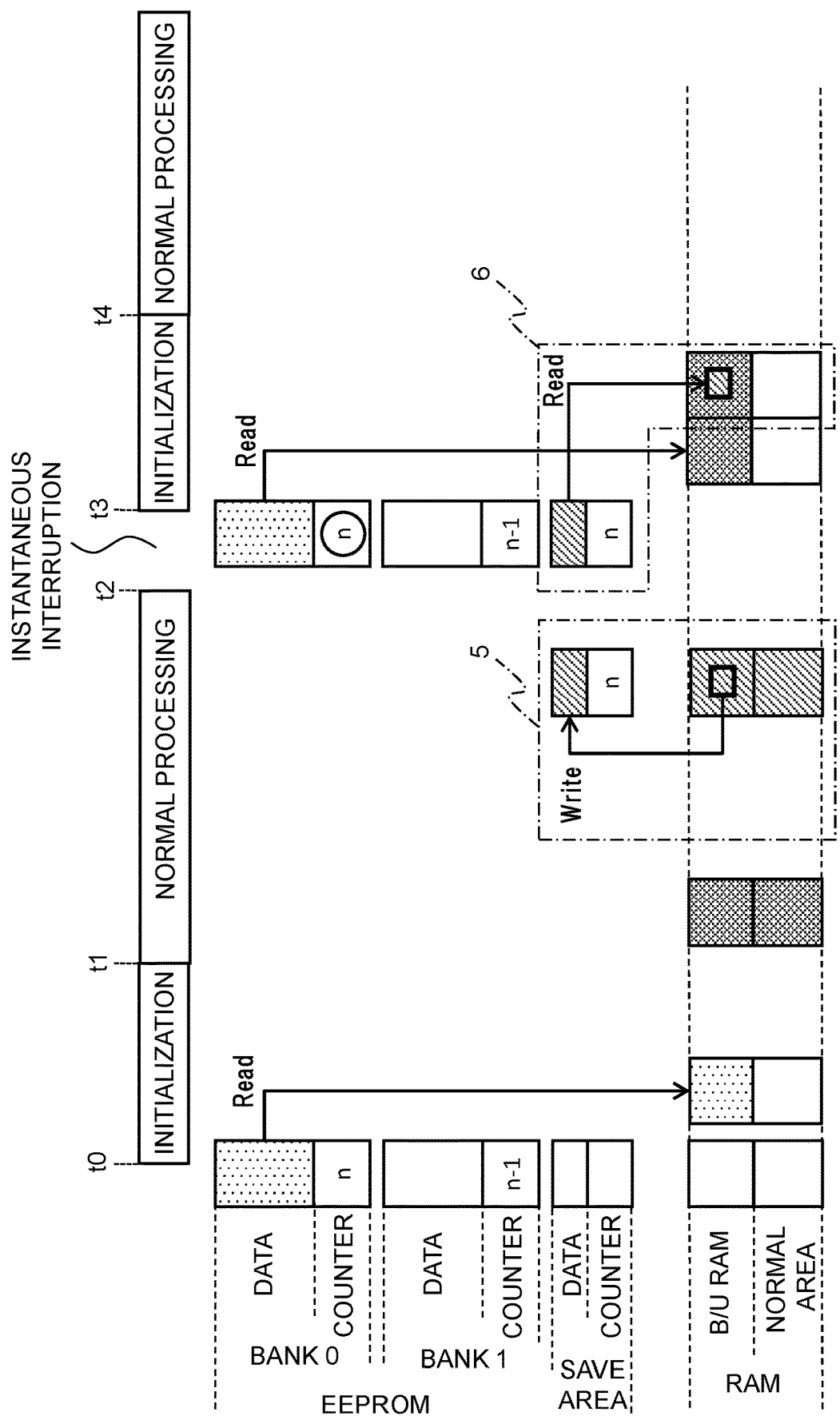

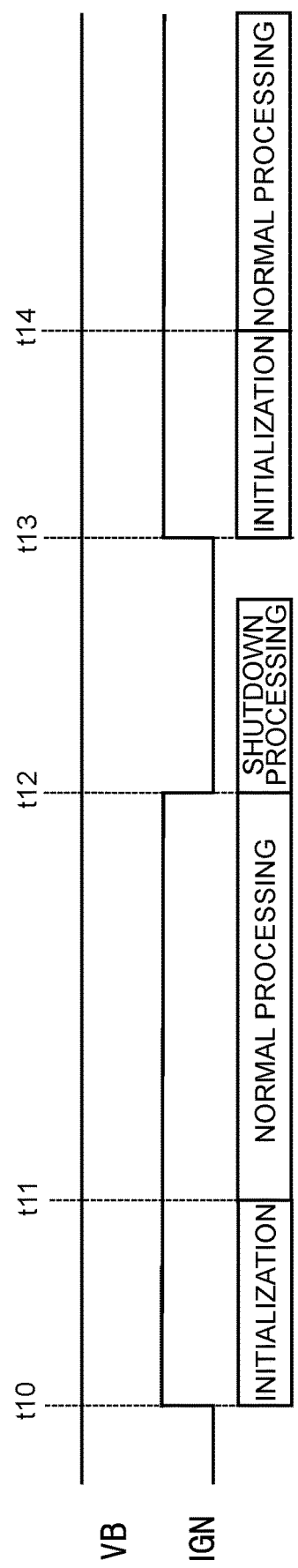

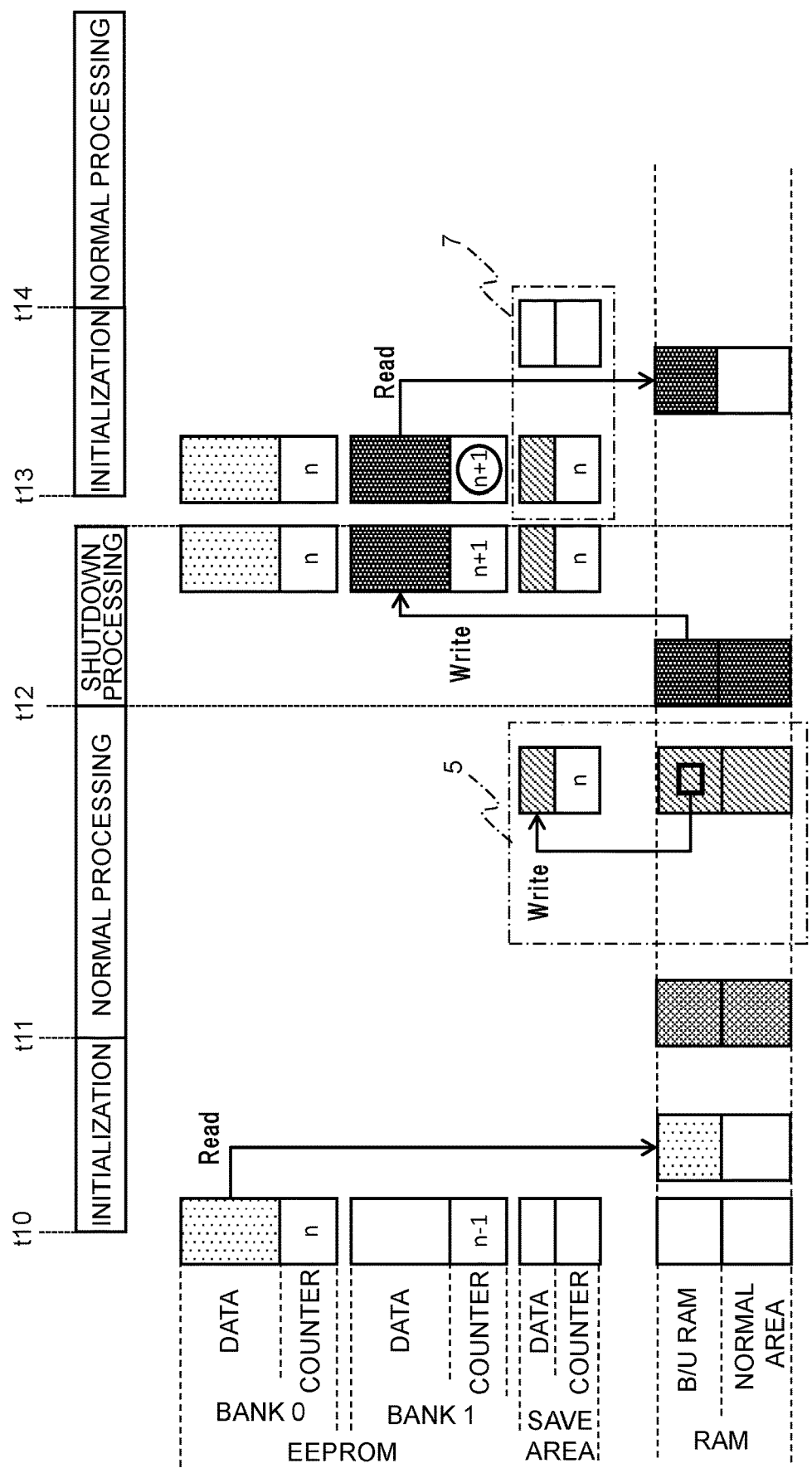
[FIG. 4B]

ELECTRONIC CONTROL UNIT AND DATA PROTECTION METHOD THEREFOR

TECHNICAL FIELD

The present invention relates to an electronic control unit including a RAM to be used as a work area and a non-volatile memory for data storage, and relates to a data protection method therefor.

BACKGROUND ART

Patent Document 1 discloses an electronic control device for an automobile, configured to constantly store, into a battery-backed SRAM, data determined to be continuously stored and updated in the RAM and additionally store the same data into a non-volatile memory, and to restore the data from the non-volatile memory if it is determined that data corruption occurs in the SRAM when the operation of the electronic control device starts. In Patent Document 1, when receiving a data output request from an external device, the electronic control device outputs the requested data after storing, into the non-volatile memory, data determined to be continuously stored, in order to prevent latest data loss due to instantaneous power supply interruption or the like.

REFERENCE DOCUMENT LIST

Patent Document

Patent Document 1: JP 2004-178067 A

SUMMARY OF THE INVENTION

Problem to be Solved by the Invention

An electronic control unit of this type involves a risk of instantaneous power supply interruption which may occur when, for example, a large current is driven by activation of the starter unless a sufficient battery capacity is available. Such instantaneous power supply interruption may destroy even data stored in a battery-backed RAM. Furthermore, instantaneous power supply interruption may reset the microcomputer, and, in this case, shutdown processing of writing, into the non-volatile memory, data determined to be continuously stored and updated is not performed, and this data may be lost. As a result, data generated during operation may no longer be held, which makes it difficult, for example, to control the on/off of the malfunction indicator lamp and to update learned values. This is problematic.

The present invention has been made in view of the above circumstances, and an object thereof is to provide an electronic control unit that is capable of holding data generated during operation regardless of instantaneous power supply interruption and thus has improved merchantable quality and fault analysis capabilities.

Another object of the present invention is to provide a data protection method for an electronic control unit, which method being capable of protecting data generated during operation regardless of instantaneous power supply interruption.

Means for Solving the Problem

An electronic control unit according to an aspect of the present invention comprises a RAM to be used as a work area; a non-volatile memory for data storage; and a controller for controlling reading of data from, and writing of data into, the RAM and the non-volatile memory. The controller is configured to: store data generated during operation of the controller into the RAM, write the data into a storage area of the non-volatile memory when the operation stops, and read the data from the non-volatile memory into the RAM when the operation starts, and control a control target using the data. When the controller determines that an improper reset of the controller is expected, the controller writes at least part of the data generated during the operation and stored in the RAM into a save area of the non-volatile memory, the save area being different from the storage area of the data. When the operation restarts from the improper reset, the controller reads, into the RAM, the data that has been written in the storage area and the data that has been written in the save area.

A data protection method for an electronic control unit according to another aspect of the present invention comprises the steps of: storing data generated during operation of a controller into a random access memory (RAM); writing the data into a non-volatile memory when the operation stops; reading the data from the non-volatile memory into the RAM when the operation starts, and controlling a control target using the data; writing at least part of the data generated during the operation and stored in the RAM into a save area of the non-volatile memory, when it is determined that an improper reset of the controller is expected, the save area being different from a storage area of the data; and reading, into the RAM, the data that has been written in the storage area and the data that has been written in the save area when the operation restarts from the improper reset.

Effects of the Invention

According to the present invention, when it is determined that an improper reset of the controller is expected, the controller waits and writes at least part of the data generated during the operation into a save area, different from the data storage area, of the non-volatile memory, and when the operation restarts from the improper reset, the controller reads, into the RAM, the data that has been written in the storage and save areas and uses the data for control. Thus, even if the data in the RAM is lost due to instantaneous power supply interruption, the data generated during the operation may be restored using the data held in the storage and save areas of the non-volatile memory. This allows protecting data generated during operation of the controller regardless of instantaneous power supply interruption. Thus, the present invention provides an electronic control unit with improved merchantable quality and fault analysis capabilities.

BRIEF DESCRIPTION OF THE DRAWINGS

FIG. 1 is a block diagram showing an example schematic configuration of an electronic control unit according to an embodiment of the present invention.

FIG. 2 is a flowchart illustrating the operation of the electronic control unit shown in FIG. 1.

FIG. 3A is a timing chart illustrating operation at the time of instantaneous power supply interruption.

FIG. 3B is a schematic diagram illustrating the operation at the time of instantaneous power supply interruption.

FIG. 4A is a timing chart illustrating operation at the time of normal shutdown.

FIG. 4B is a schematic diagram illustrating the operation at the time of normal shutdown.

MODE FOR CARRYING OUT THE INVENTION

An embodiment of the present invention will be described below with reference to the drawings. FIG. 1 shows a schematic configuration of an electronic control unit (ECU) 10 according to an embodiment of the present invention. ECU 10 is adapted for a vehicle, specifically adapted to control an ignition device, a fuel pump, an automatic transmission, and the like of an automobile. ECU 10 includes a processor (controller) 1 such as a central processing unit (CPU), a random access memory (RAM) 2 to be used as a work area, a non-volatile memory, such as an electrically erasable and programmable read only memory (EEPROM) 3, for data storage capable of holding data even if power supply is disconnected therefrom. Here, although EEPROM 3 is incorporated in ECU 10, it may be externally connected to ECU 10.

Processor 1 acquires information on parts of the vehicle from various sensors. Based on the information from these sensors, processor 1 calculates operation variables for control-target devices such as the ignition device, fuel pump, and automatic transmission. Examples of such operation variables may include ignition timing, a fuel injection amount, and a transmission gear ratio according to the vehicle speed or engine rotation speed. Then, processor 1 outputs the resultant control information to the control-target devices such as the ignition device, fuel pump, and automatic transmission. Processor 1, RAM 2, and EEPROM 3 are connected to each other via a bus 4, and reading data from, and writing data into, RAM 2 and EEPROM 3 is controlled by processor 1.

RAM 2 includes a backup area (B/U RAM) and a normal area. The normal area is used as a work area. The backup area is supplied with a data holding voltage from a battery. Alternatively, however, an ordinary RAM without battery backup capabilities may be used as RAM 2. EEPROM 3 previously stores therein various control programs corresponding to the control-target devices, for example. When ECU 10 is initialized at the time of turning on an ignition switch IGN, these control programs are read from EEPROM 3 to the normal area of RAM 2 so as to be used for controlling the control-target devices. Furthermore, in shutdown processing, learned values that have been developed and stored in the backup area of RAM 2 over a driving cycle DC are written into EEPROM 3 for updating the existing data, and fault information, etc. given by on-board diagnostics (OBD) function is stored in EEPROM 3.

FIG. 2 shows the operation of the electronic control unit shown in FIG. 1. The flowchart of FIG. 2 illustrates an example operation in which saved data is erased after instantaneous power supply interruption and after shutdown processing. First, ECU 10 determines whether or not the ignition switch IGN is turned on (step S1). When determining that the ignition switch IGN is turned on, ECU 10 is initialized (step S2). When determining that the ignition switch IGN is off, ECU 10 waits and repeats the determination operation until determining that the ignition switch IGN is on. In the initialization of ECU 10, the control programs are read from EEPROM 3 and written into the normal area of RAM 2, under the control of processor 1.

Subsequently, processor 1 performs normal processing on the control-target devices by using the control programs (step S3). In the normal processing, for example, based on information from various sensors, processor 1 calculates the operation variables such as ignition timing, a fuel injection amount, and a transmission gear ratio, and controls the control-target devices such as the ignition device, fuel pump, and automatic transmission by providing the operation variables to these control-target devices. The data generated during operation of the normal processing over a driving cycle is stored in RAM 2.

In the next step S4, ECU 10 determines whether or not a predetermined condition that may involve a future instantaneous power supply interruption has been established. When ECU 10 determines that this predetermined condition is established, at least part of the data stored in RAM 2 is written into the save area of EEPROM 3 and a count value is written into the counter area of EEPROM 3 (step S5), under the control of processor 1. Then, ECU 10 determines whether or not an instantaneous power supply interruption has occurred (step S6). When determining that an instantaneous interruption has occurred, ECU 10 is initialized upon recovery of the power supply voltage (step S7). Then, ECU 10 determines whether to write back the data saved in the save area of EEPROM 3 under the control of processor 1 (step S8). When ECU 10 determines to write back the data saved in the save area, the data is read and written back into RAM2 (step S9), and the operation returns to step S3 in which processor 1 performs the normal processing. As a result, the data to be used in subsequent driving cycles can be restored before instantaneous power supply interruption actually occurs.

When ECU 10 determines, in step S8, not to write back the data saved in the save area of EEPROM 3, ECU 10 then determines whether to erase the data in the save area (step S10). When ECU 10 determines to erase the data in the save area of EEPROM 3, the data is erased (step S11) and the operation returns to step S3 in which processor 1 performs the normal processing. On the other hand, when ECU 10 determines not to erase the data in the save area, the data is not erased and the operation returns to step S3 in which processor 1 performs the normal processing. When ECU 10 determines in step S6 that no instantaneous power supply interruption has occurred, the operation returns to step S3 in which processor 1 performs the normal processing.

On the other hand, when ECU 10 determines in step S4 that the predetermined condition has not been established, ECU 10 then determines whether or not the ignition switch IGN is turned off (step S12). When determining that the ignition switch IGN is turned off, ECU 10 performs the shutdown processing (step S13), and erases the data in the save area of EEPROM 3 (step S14). Then, the operation ends. In the shutdown processing, the data stored in RAM 2 is written into the storage area of EEPROM 3 and "count value n+1" is written into the corresponding counter area, under the control of processor 1.

When ECU 10 determines in step S12 that the ignition switch IGN is turned on, the operation returns to step S3 in which processor 1 performs the normal processing on the control-target devices by using the control programs.

In the above example, the saved data erasure in step S11 occurs after ECU 10 is initialized in step S7, that is, after data is properly read from the EEPROM 3 and the backup area of RAM 2. This ensures that available data is highly reliable. In turn, however, since the saved data erasure in step S11 occurs at timing between when the ignition switch IGN gets turned on and when the vehicle operation starts, the erasure may fail to complete, if processor 1 stops at the timing of cranking or the like.

On the other hand, the saved data erasure in step S14 occurs before stopping the power supply to processor 1 and the backup area of RAM 2. This generally ensures that the erasure processing is performed after the power supply system has been stabilized. However, even if the backup is successfully completed at the time of turning off the ignition, the backup data may fail to be successfully read when ECU 10 is initialized at the time of turning on the ignition. In this case, the backup data may be lost.

If the saved data erasure occurs in both steps S11 and S14, more reliable data erasure is ensured. This is because even if data erasure before stopping processor 1 is not properly performed, another data erasure can be performed at the time of turning on the ignition. However, this requires two iterations of the erasure determination, thus making the processing redundant and a bit more time consuming. Therefore, in consideration of the advantages and disadvantages as described above, it is favorable to erase the saved data by selectively performing either or both of the steps S11 and S14 as necessary.

FIGS. 3A and 3B illustrate the operation of the electronic control unit shown in FIG. 1 at the time of instantaneous power supply interruption. FIG. 3A shows the state of the ignition switch IGN and the operation timing of ECU 10 with respect to a battery voltage VB. FIG. 3B schematically shows operations of data reading from, and data writing into, RAM 2 and EEPROM 3 in association with the operation of ECU 10 shown in FIG. 3A.

As shown in FIG. 3A, ECU 10 is initialized at timing (time point t0) when the ignition switch IGN gets turned on (set to the "H" level). As shown in FIG. 3B, in the initialization of ECU 10, data read from EEPROM 3 is written into RAM 2 under the control of processor 1. Here, the storage area of EEPROM 3 has Bank 0, Bank 1, and a save area. Each of Bank 0, Bank 1, and the save area includes a data storage area and a counter area for storing a count value. In the illustrated example, RAM 2 includes a backup area and a normal area. Alternatively, however, an ordinary RAM without battery backup capabilities may be used as RAM 2.

In this example, the latest data (including the latest control programs) in the storage area corresponds to the count value n, and is stored in Bank 0. The latest data is read from Bank 0 of EEPROM 3 and written into the backup area of RAM 2.

When the initialization is completed at time point t1, the normal processing is then performed. In the period between time points t1 and t2, processor 1 performs the normal processing using the normal area of RAM 2. Data generated during the operation of the normal processing and assumed to be used in subsequent driving cycles of the vehicle is written into the backup area. Such data to be used in subsequent driving cycles includes fault information (such as diagnostic information about each device and/or the on/off state of a malfunction indicator lamp MIL), learned values, display data of a diagnostic tool, and information stored at the time of fault occurrence. For example, if any fault (malfunction) is detected, such data including fault information, etc. is written into the backup area of RAM 2.

When the predetermined condition is established in the period between time points t1 and t2 during which the normal processing is performed, part of the data stored in the backup area of RAM 2 is written into the data area within the save area of EEPROM 3 and the count value n is written into the counter area of EEPROM 3, as shown in the portion enclosed by dashed-dotted line 5. Here, the predetermined condition involves an expected decrease of the battery voltage VB (power supply voltage) to a level low enough to stop the operation of processor 1, which serves as the controller. Specifically, the predetermined condition may be determined upon detecting that a current larger than a predetermined value is driven by the control over the vehicle by processor 1, and thus determining that a decrease of the battery voltage VB is expected. Alternatively, the battery voltage VB may be measured, and the predetermined condition may be determined upon detecting a decrease of the measured battery voltage VB.

More specifically, the predetermined condition may be established when the starter is activated, immediately before a resetting operation of processor 1 is performed based on its self-diagnosis, when the battery has deteriorated due to aging or the like, when a high power consuming device such as an air conditioner is activated, when multiple devices such as power window and lumps are simultaneously activated, any combination thereof, or the like. Deterioration of the battery can be estimated based on the fluctuation of the battery voltage VB depending on the presence or absence of the load and/or based on the length of voltage recovery time.

The data to be written into the save area of EEPROM 3 is data generated during the operation of ECU 10 and assumed to be used in subsequent driving cycles, such as data stored from when the ignition switch IGN gets turned on to when the battery voltage VB decreases. Specifically, such data includes fault information, learned values, display data of the diagnostic tool, and information stored at the time of fault occurrence. In this example, data including fault information indicating whether or not the malfunction indicator lamp MIL is turned on, etc. is used. Also, such data may include a snapshot captured upon fault occurrence and/or data of the drive recorder. In addition, the count value of the bank that stores therein the latest data read from EEPROM 3 in the current driving cycle is written into the counter area of the save area.

When, for example, a large current is driven by any factor such as activation of the starter for starting the engine or for restarting the engine from engine stop during the normal processing, the battery voltage VB may decrease below the operating voltage of processor 1. In this case, when the engine starts at time point t3 after the elapse of a predetermined time, ECU 10 is initialized by a power-on reset of processor 1.

At the time of this power-on reset, it is determined whether or not processor 1 was normally shut down the last time, in other words, whether or not this was an improper reset. As used herein, the "improper reset" refers to a reset operation of processor 1 that occurs upon engine start (when the operation of processor 1 restarts) after the battery voltage VB has temporarily decreased to a level low enough to stop the operation of processor 1 while the ignition switch IGN of the vehicle, which is a control target, is turned on. When it is determined that this was an improper reset, the data written in the save area of EEPROM 3 is written back into RAM 2 at the time of initializing ECU 10.

That is, first, the latest data (count value=n) is read from the data storage area of Bank 0 in EEPROM 3 and written into the backup area of RAM 2. After that, when the count value of the save area is the same (=n) as the count value of Bank 0 of EEPROM 3, data including fault information, learned values, display data of the diagnostic tool, and information stored at the time of fault occurrence (e.g., information indicating whether or not the malfunction indicator lamp MIL is turned on) that has been written into the save area of EEPROM 3 is read and overwritten on the existing data in the backup area of RAM 2, as shown in the portion enclosed by dashed-dotted line 6.

In this way, even if the information that has been stored since the turning on of the ignition switch IGN is lost from the backup area due to instantaneous power supply interruption, this information can be recovered by writing back the data saved in EEPROM 3 into the backup area at the time of a power-on reset. Thus, even if instantaneous power supply interruption occurs, and data to be used in subsequent driving cycles (e.g., information indicating whether or not the malfunction indicator lamp MIL is turned on) is lost from RAM 2, such data is also held in the save area of EEPROM 3 and restored through initialization of ECU 10 after the instantaneous power supply interruption. Therefore, the electronic control unit according to the present invention has improved merchantable quality and fault analysis capabilities.

When the initialization of ECU 10 is completed, ECU 10 performs the normal processing using the backup and normal areas of RAM 2 (time point t4). After time point t4, ECU 10 repeats the operation described above.

FIGS. 4A and 4B illustrate the operation of ECU 10 at the time of normal shutdown. FIG. 4A shows the state of the ignition switch IGN and the operation timing of ECU 10 with respect to a battery voltage VB. FIG. 4B schematically shows operations of data reading from, and data writing into, RAM 2 and EEPROM 3 in relation to the operation of ECU 10 shown in FIG. 4A.

As shown in FIG. 4A, ECU 10 is initialized at timing (time point t10) when the ignition switch IGN gets turned on (set to the "H" level). As shown in FIG. 4B, in the initialization of ECU 10, data read from EEPROM 3 is written into RAM 2 under the control of processor 1.

In this example, the latest data (including the latest control programs) in the storage area corresponds to the count value n, and is stored in Bank 0. The latest data is read from Bank 0 of EEPROM 3 and written into the backup area of RAM 2.

When the initialization is completed at time point t11, the normal processing is then performed. In the period between time points t11 and t12, processor 1 performs the normal processing using the normal area of RAM 2. Data generated during the operation of the normal processing and assumed to be used in subsequent driving cycles is written into the backup area.

When the predetermined condition is established in the period between time points t11 and t12 during which the normal processing is performed, part of the data stored in the backup area of RAM 2 is written into the data storage area within the save area of EEPROM 3 and the count value n is written into the counter area of EEPROM 3, as shown in the portion enclosed by dashed-dotted line 5.

After that, when the ignition switch IGN is turned off at time point t12, shutdown processing is performed. In the shutdown processing, the data stored in the backup area of RAM 2 is written into the data storage area of the bank 1 in EEPROM 3. In addition, "count value n+1" is written into the counter area of the bank 1. At this time, the battery voltage VB takes a normal value, and thus processor 1 shuts down normally.

When the ignition switch IGN gets turned on at time point t13 after the elapse of a predetermined time, ECU 10 is initialized by a power-on reset of processor 1. At the time of this power-on reset, the latest data is read from the data storage area of Bank 1 in EEPROM 3 and written into the backup area of RAM 2. Here, the count value (=n) in the save area differs from the count value (=n+1) in Bank 1 of EEPROM 3, which stores therein the latest data. Thus, the existing data in the backup area of RAM 2 is not overwritten, and the data in the save area (data storage area and counter area) in EEPROM 3 is erased, as shown in the portion enclosed by dashed-dotted line 7. Alternatively, the data in the save area in EEPROM 3 may be erased after the completion of the shutdown processing. Erasing the data and count value written into the save area as described above prevents or reduces instances of reading these data and count value by mistake. Note that when erasing the data in the backup area of RAM 2 at the time of reprogramming, tester clearing or the like, it is also necessary to erase the data in the save area of EEPROM 3.

When the initialization of ECU 10 is completed, ECU 10 performs the normal processing using the backup and normal areas of RAM 2 (time point t14). After time point t14, ECU 10 repeats the operation described above.

Thus, in normal shutdown, data to be used in subsequent driving cycles is updated using the backup area of RAM 2, and also written and held into the save area of EEPROM 3, so that the initialization processing, normal processing, and shutdown processing can be performed as in the conventional normal writing processing.

As described above, according to the present invention, at least part of data to be used in subsequent driving cycles is written into the save area of EEPROM 3, and, if an improper reset occurs, such data is restored by writing back, into RAM 2, the data that has been written into the save area, when operation restarts from the improper reset. Thus, even if the data to be used in subsequent driving cycles is lost from RAM 2 due to instantaneous power supply interruption, such data is also held in the save area of EEPROM 3. Accordingly, when the operation restarts after an improper reset of processor 1 due to instantaneous power supply interruption or the like, it is possible, for example, to turn off the malfunction indicator lamp and to update learned values. Therefore, the electronic control unit according to the present invention has improved merchantable quality and fault analysis capabilities.

Although part of data stored in the backup area of RAM 2 is written into the data storage area of the save area of EEPROM 3 in the above embodiment, all the data stored in the backup area may alternatively be written into the save area.

Note, however, that a larger volume of data requires more time to write. Accordingly, writing increased data into the save area of EEPROM 3 involves risks such as inconsistency of data between the start and finish of the data writing or destruction of data due to instantaneous power supply interruption that occurs during the data writing. Therefore, what data to save may be determined in consideration of these risks associated with the extended time for data writing as well as what information is desired to be held, how important the information is, to what device the present invention is applied, and the like.

Hereinabove, an example has been described in which two banks are provided in EEPROM 3 and data is alternately written into these two banks to allow reading the latest data. Alternatively, however, three or more banks may be provided in EEPROM 3 and data is sequentially written into these banks to allow reading the latest data. Furthermore, although the present invention has been described using application to an electronic control unit for a vehicle as an example, of course the present invention may be applicable to various other types of electronic control units.

REFERENCE SYMBOL LIST

1 Processor (Controller)
2 RAM
3 EEPROM (Non-volatile memory)

4 Bus
10 Electronic control unit (ECU)

The invention claimed is:

1. An electronic control unit comprising:
a random access memory (RAM) utilizable as a work area;
a non-volatile memory for data storage; and
a controller for controlling reading of data from, and writing of data into, the RAM and the non-volatile memory, the controller being configured to:
store data generated during operation of the controller into the RAM,
write the data into a storage area of the non-volatile memory when the operation stops, and
read the data from the non-volatile memory into the RAM when the operation starts, and control a control target using the data,
in response to a determination that an improper reset of the controller is expected, write at least part of the data to be used in a subsequent driving cycle of a vehicle generated during the operation and stored in the RAM into a save area of the non-volatile memory, the save area being different from the storage area of the data,
when the operation restarts from the improper reset, read into the RAM, the data that has been written in the storage area and the data that has been written in the save area, the improper reset of the controller being a reset operation of the controller that occurs when the operation of the controller restarts after a power supply voltage of the controller has temporarily decreased to a level low enough to stop the operation of the controller while an ignition switch of the vehicle, which is the control target, is turned on, and
determine that the improper reset of the controller is expected either upon detecting that a current larger than a predetermined value is driven by control over the vehicle by the controller, and thus determining that a decrease of the power supply voltage of the controller is expected, or upon detecting a decrease of the power supply voltage.

2. The electronic control unit according to claim 1, wherein the non-volatile memory previously stores therein a control program corresponding to the control target.

3. The electronic control unit according to claim 1, wherein:
the controller is configured to acquire information relating to the vehicle from a sensor, and
the controller is configured to, based on the information from the sensor, calculate an operation variable for the control target, and control the control target using the operation variable.

4. The electronic control unit according to claim 3, wherein the controller is initialized when the ignition switch of the vehicle gets turned on.

5. The electronic control unit according to claim 1, wherein the data written into the save area of the non-volatile memory includes:
at least any one of fault information, a learned value, display data of a diagnostic tool, and information stored at the time of fault occurrence; and
a count value corresponding to latest data written into the storage area of the non-volatile memory.

6. The electronic control unit according to claim 1, wherein when the controller determines that the improper reset of the controller is expected but the controller is not reset, the data that has been written in the save area of the non-volatile memory is erased.

7. A data protection method for an electronic control unit, comprising the steps of:
storing data generated during operation of a controller into a random access memory (RAM);
writing the data into a non-volatile memory when the operation stops;
reading the data from the non-volatile memory into the RAM when the operation starts, and controlling a control target using the data;
writing at least part of the data to be used in a subsequent driving cycle of a vehicle generated during the operation and stored in the RAM into a save area of the non-volatile memory, when it is determined that an improper reset of the controller is expected, the save area being different from a storage area of the data; and
reading, into the RAM, the data that has been written in the storage area and the data that has been written in the save area when the operation restarts from the improper reset, the improper reset of the controller being a reset operation of the controller that occurs when the operation of the controller restarts after a power supply voltage of the controller has temporarily decreased to a level low enough to stop the operation of the controller while an ignition switch of the vehicle, which is the control target, is turned on, and
wherein determining that the improper reset of the controller is expected occurs either upon detecting that a current larger than a predetermined value is driven by control over the vehicle by the controller, and thus determining that a decrease of the power supply voltage of the controller is expected, or upon detecting a decrease of the power supply voltage.

8. The data protection method for the electronic control unit according to claim 7, further comprising the step of previously storing a control program corresponding to the control target into the non-volatile memory.

9. The data protection method for the electronic control unit according to claim 7, further comprising the steps of:
causing the controller to acquire information relating to the vehicle from a sensor; and
causing the controller to calculate, based on the information from the sensor, an operation variable for the control target, and to control the control target using the operation variable.

10. The data protection method for the electronic control unit according to claim 9, further comprising the step of initializing the controller when the ignition switch of the vehicle gets turned on.

11. The data protection method for the electronic control unit according to claim 7, wherein the data written into the save area of the non-volatile memory includes:
at least any one of fault information, a learned value, display data of a diagnostic tool, and information stored at the time of fault occurrence; and
a count value corresponding to latest data written into the storage area of the non-volatile memory.

12. The data protection method for the electronic control unit according to claim 7, further comprising the step of erasing the data that has been written in the save area of the non-volatile memory when it is determined that the improper reset of the controller is expected but the controller is not reset.

* * * * *